(12) United States Patent
Treu et al.

(10) Patent No.: US 8,530,904 B2
(45) Date of Patent: Sep. 10, 2013

(54) SEMICONDUCTOR DEVICE INCLUDING A NORMALLY-ON TRANSISTOR AND A NORMALLY-OFF TRANSISTOR

(75) Inventors: Michael Treu, Villach (AT); Ralf Siemieniec, Villach (AT)

(73) Assignee: Infineon Technologies Austria AG, Villach (AT)

( * ) Notice: Subject to any disclaimer, the term of this patent is extended or adjusted under 35 U.S.C. 154(b) by 687 days.

(21) Appl. No.: 12/727,321

(22) Filed: Mar. 19, 2010

(65) Prior Publication Data

US 2011/0227095 A1    Sep. 22, 2011

(51) Int. Cl.
*H01L 29/24* (2006.01)

(52) U.S. Cl.
USPC ....... 257/77; 257/473; 257/578; 257/E29.104

(58) Field of Classification Search
USPC .............................. 257/77, 473, E29.104, 578
See application file for complete search history.

(56) References Cited

U.S. PATENT DOCUMENTS

| 6,157,049 A | 12/2000 | Mitlehner et al. |
| 2006/0027840 A1* | 2/2006 | Wohlmuth ............... 257/267 |

FOREIGN PATENT DOCUMENTS

DE      19610135 C1    6/1997

\* cited by examiner

*Primary Examiner* — Lynne Gurley
*Assistant Examiner* — Vernon P Webb
(74) *Attorney, Agent, or Firm* — Murphy, Bilak & Homiller, PLLC

(57) ABSTRACT

A semiconductor device is disclosed. One embodiment includes a first semiconductor die having a normally-off transistor. In a second semiconductor die a plurality of transistor cells of a normally-on transistor are formed, wherein one of a source terminal/drain terminal of the normally-on transistor is electrically coupled to a gate terminal of the normally-on transistor and the other one the source terminal/drain terminal of the normally-off transistor is electrically coupled to one of a source terminal/drain terminal of the normally-on transistor. The second semiconductor die includes a gate resistor electrically coupled between the gate terminal of the normally-off transistor and respective gates of the plurality of transistor cells. A voltage clamping element is electrically coupled between the gate terminal and the one of the source terminal/drain terminal of the normally-on transistor.

23 Claims, 6 Drawing Sheets

SEMICONDUCTOR DEVICE INCLUDING A NORMALLY-ON TRANSISTOR AND A NORMALLY-OFF TRANSISTOR

BACKGROUND

Depending on a variety of conditions, normally-on transistors may have superior electrical characteristics than normally-off transistors within the same semiconductor substrate material. As an example, this may be due to interface properties between a gate insulator and a semiconductor channel region of a Field Effect Transistor (FET).

A cascode circuit of a normally-on transistor in a first semiconductor die and a normally-off transistor within a second semiconductor die allows to set up a normally-off semiconductor switch that may include beneficial electrical properties of the normally-on transistor such as low-on resistance or high-reverse blocking capabilities.

When forming a normally-off semiconductor switch using a cascode circuit including a normally-off transistor and a normally-on transistor, a plurality of requirements having an impact on the device reliability have to be met, e.g., avoidance of critical operation conditions such as avalanche breakdown or avoidance of generation of oscillations.

With regard to a semiconductor switch including a normally-on transistor and a normally-off transistor, a need exists for an improved device reliability.

For these and other reasons, there is a need for the present invention.

SUMMARY

According to an embodiment of a semiconductor device, the semiconductor device includes a first semiconductor die and a second semiconductor die. The first semiconductor die includes a normally-off transistor and the second semiconductor die includes a plurality of transistor cells of a normally-on transistor. One of a source terminal/drain terminal of the normally-off transistor is electrically coupled to a gate terminal of the normally-on transistor, the According to an embodiment of a Junction Field Effect Transistor (JFET), the JFET includes a SiC semiconductor substrate of a first conductivity type, a plurality of transistor cells and a gate resistor. The plurality of transistor cells includes a common drain at a rear side of the SiC semiconductor substrate. Each of the plurality of transistor cells includes gate regions and source regions at a front side of the SiC semiconductor substrate. One terminal of the gate resistor is electrically coupled to a gate terminal and the other terminal of the gate resistor is electrically coupled to the gates of the plurality of transistor cells. The JFET further includes a sequence of a first semiconductor zone of a second conductivity type opposite to the first conductivity type, a second semiconductor zone of the first conductivity type and a third semiconductor zone of the second conductivity type electrically coupled between the gate terminal and a source terminal. The source terminal is electrically coupled to the source regions of the plurality of transistor cells.

BRIEF DESCRIPTION OF THE DRAWINGS

The accompanying drawings are included to provide a further understanding of embodiments and are incorporated in and constitute a part of the specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF THE INVENTION

In the following detailed description reference is made to the accompanying drawings, which form a part hereof, and in which are shown by way of illustration specific embodiments in which the invention may be practiced. In this regard, directional terminology, such as "top", "bottom", "front", "back", "waning", "trailing", etc., is used with reference to the orientation of the FIGURE(S) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description thereof is not to be taken in limiting sense, and the scope of the present invention is defined by the appended claims.

It is to be understood that the features of the various exemplary embodiments described herein may be combined with each other, unless specifically noted otherwise.

Figure 1:
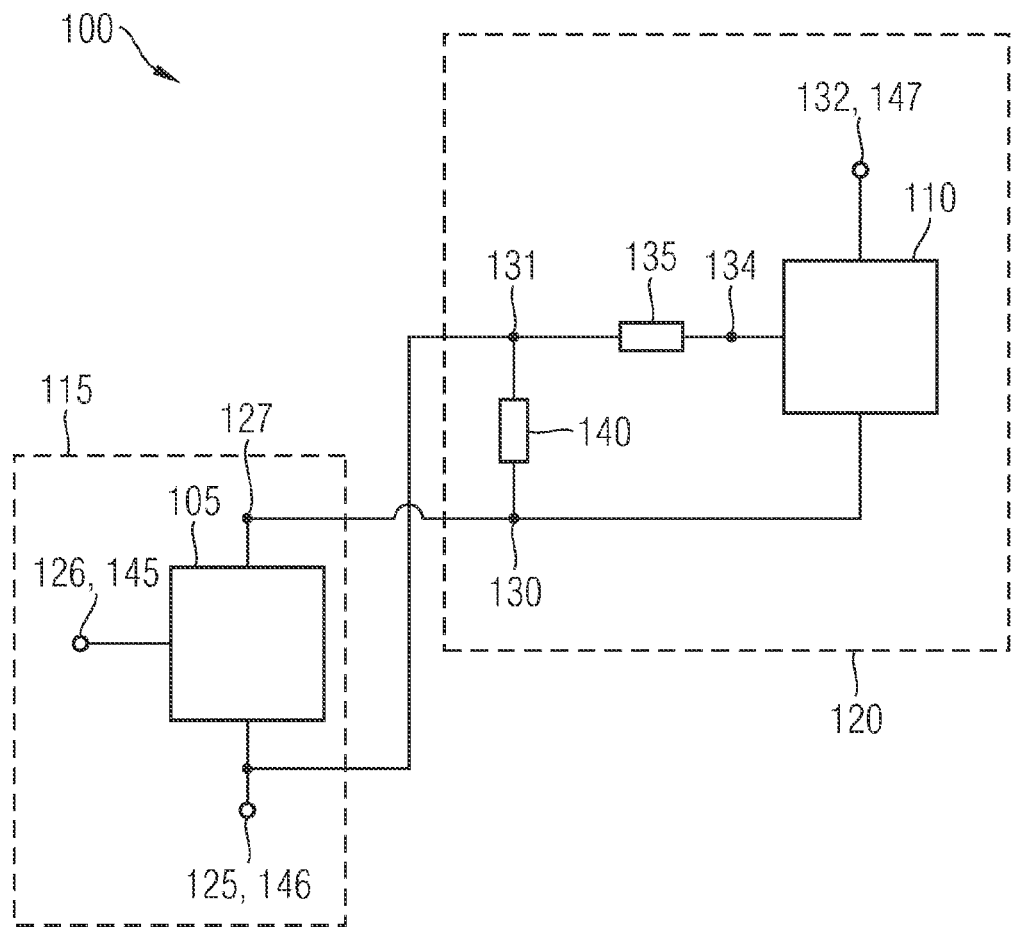
FIG. 1 illustrates a schematic circuit diagram of a semiconductor switch including a cascode circuit of a normally-off transistor in a first semiconductor die and a normally-on transistor, a gate resistor and a voltage clamping element in a second semiconductor die, respectively.

FIG. 1 schematically illustrates a circuit diagram of a normally-off semiconductor switch 100 including a cascode circuit of a normally-off transistor 105 and a normally-on transistor 110. As an example, the normally-on transistor 110 may be any one of Junction Field Effect Transistor (JFET), Metal Insulator Semiconductor Field Effect Transistor (MISFET) such as a Metal Oxide Semiconductor Field Effect Transistor (MOSFET) and derivatives such as Double-diffused MOSFET (DMOSFET), High Electron Mobility Transistor (HEMT) or any transistor including a gate configured to control the conductivity between source and drain by voltage application. The normally-off transistor 105 may also be any one of Junction Field Effect Transistor (JFET), Metal Insulator Semiconductor Field Effect Transistor (MISFET) such as a Metal Oxide Semiconductor Field Effect Transistor (MOSFET) and derivatives such as Double-diffused MOSFET (DMOSFET), High Electron Mobility Transistor (HEMT) or any transistor including a gate configured to control the conductivity between source and drain by voltage application.

The normally-off transistor 105 is formed within a first semiconductor die 115. The normally-on transistor 110 is formed within a second semiconductor die 120 and includes a plurality of transistor cells.

One terminal 125 of a source/drain of the normally-off transistor 105 is electrically coupled to a gate terminal 131 of the normally-on transistor 110, the other terminal 127 of the source/drain of the normally-off transistor 105 is electrically coupled to one terminal 130 of a source/drain of the normally-on transistor 110. The second semiconductor die 120 furthermore includes a gate resistor 135 electrically coupled between the gate terminal 131 of the normally-off transistor 110 and respective gates 134 of the plurality of transistor cells of normally-on transistor 110. As an example, the one terminals 125, 130 may be source terminals in case transistors 105, 110 are n-channel transistors. As a further example, the one terminals 125, 130 may be drain terminals in case transistors 105, 110 are p-channel transistors. As yet another example, the one terminal 125 may be a drain terminal and the one terminal 130 may be a source terminal in case transistor 105 is a p-channel transistor and transistor 110 is an n-channel transistor. The one terminal 125 may also be a source terminal and the one terminal 130 may be a drain terminal in case transistor 105 is an n-channel transistor and transistor 110 is a p-channel transistor.

For illustration purposes, the plurality of transistor cell gates are represented in FIG. 1 by common node 134. A voltage clamping element 140 is formed within the second semiconductor die 120 and is electrically coupled between the gate terminal 131 and the one terminal 130 of source/drain of the normally-on transistor 110.

As used herein, the term "electrically coupled" is not meant to mean that the elements must be directly coupled together so that intervening elements may be provided between the "electrically coupled" elements.

The term "normally-on" transistor used herein refers to a depletion mode transistor being in a conductive, i.e., "on" state when no voltage is applied to the gate and turns into a non-conductive, i.e., "off" state when a voltage is applied to the gate. The term "normally-off" transistor refers to an enhancement mode transistor that is in the non-conductive, i.e., "off" state when no voltage is applied to the gate and turns into a conductive, i.e., "on" state when a voltage is applied to the gate.

The circuit arrangement of the normally-off transistor 105 and the normally-off transistor 110 constitutes a three-terminal normally-off semiconductor switch 100 including a gate terminal 145 corresponding to the gate terminal 126 of the normally-off transistor 105, one terminal 146 of a source/drain corresponding to the one terminal 125 of the source/drain of the normally-off transistor and another terminal 147 of a source/drain corresponding to the terminal 132 of the source/drain of the normally-on transistor 110.

By provision of voltage clamping element 140, the voltage between source and drain terminals of normally-off transistor 105 may be limited. Thus, occurrence of avalanche breakdown in normally-off transistor 105 during operation may be eliminated or reduced and thus, device reliability of the semiconductor switch 100 may be improved. Furthermore, by limiting the voltage drop between source and drain terminals of normally-off transistor 105, the voltage class of normally-off transistor 105 may be reduced and thus, chip area may be saved.

The normally-on transistor 110 may be a high-voltage transistor, and the normally-off transistor 105 may be a low-voltage transistor, whereas a ratio of electrical breakdown voltages of the normally-off transistor 105 and the normally-on transistor 110 may be within a range of 1:5 to 1:100, or within a range of 1:10 to 1:50, for example.

According to an embodiment, the normally-off transistor 105 may be a Metal Oxide Semiconductor Field Effect Transistor (MOSFET) formed within a semiconductor substrate made of silicon. The normally-on transistor 110 may be a Junction Field Effect Transistor (JFET) formed within a semiconductor substrate made of SiC.

According to another embodiment, the normally-on transistor 110 may be a High Electron Mobility Transistor (HEMT), e.g., a GaN HEMT.

The gate resistor 135 is formed within the second semiconductor die 120 and may have a value within a range of 0.5Ω to 500Ω, or within a range of 1Ω to 50Ω. As an example, the gate resistor 135 may be formed within the semiconductor substrate of the second semiconductor die 120 as a doped semiconductor region formed either by diffusion or implant of dopants. As a further example, the gate resistor 135 may be formed within a wiring area above an active area of the device.

Figure 2:
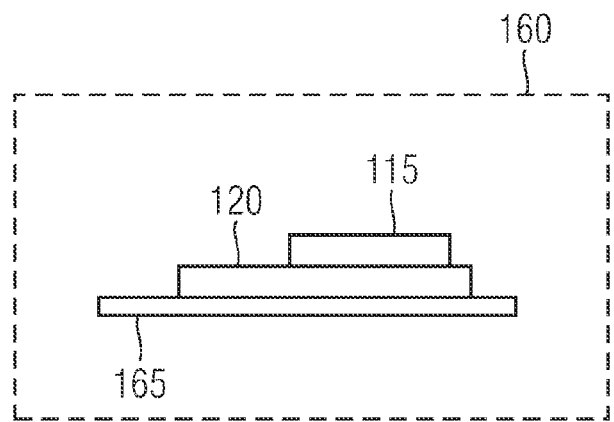
FIG. 2 illustrates a schematic cross-sectional view of an arrangement of the first semiconductor die and the second semiconductor die within a package.

FIG. 2 illustrates a schematic cross-sectional view of an arrangement of the first semiconductor die 115 and the second semiconductor die 120 within a package 160. The second semiconductor die 120 including the normally-on transistor 110 is arranged on a leadframe 165. The second semiconductor die 120 may be placed with its rear side on the leadframe 165. At the rear side of the second semiconductor die 120, a drain contact of normally-on transistor 110 may be formed. The first semiconductor die 115 including the normally-on transistor 105 is arranged on a front side of the second semiconductor die 120. The normally-on and normally-off transistors 110, 105 may be electrically coupled to pins of package 160 by bond wires, for example (not illustrated in FIG. 2). According to another embodiment, the normally-on and normally-off transistors 110, 105 may be arranged in separate packages.

When forming the normally-on transistor 110 as a high-voltage transistor in a SiC semiconductor substrate, heat dissipation may be improved since heat conductivity of SiC is superior to other semiconductor substrate materials such as Si. Furthermore, heat generated within the second semiconductor die 120 may be dissipated via the leadframe 165 being a heat sink.

The package 160 may include three pins. With regard to the cascode circuit illustrated in FIG. 1, a first one of these pins may be electrically coupled to the gate terminal 145, a second one of these pins may be electrically coupled to the one terminal 146 and a third one of these pins may be electrically coupled to the other terminal 147.

Figure 3:
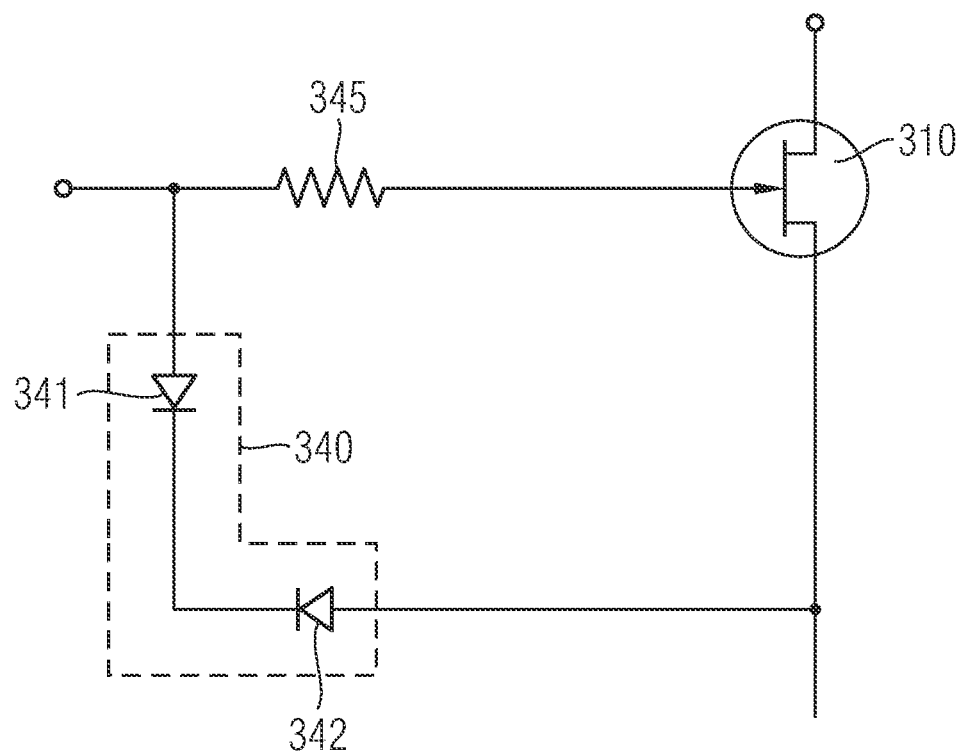
FIG. 3 illustrates a schematic circuit diagram of a normally-on JFET, a gate resistor and a voltage clamping element including semiconductor diodes.

FIG. 3 illustrates a schematic circuit diagram of a normally-on JFET 310, a gate resistor 345 and a voltage clamping element 340 including semiconductor diodes 341, 342 connected anti-serial, i.e., both cathodes connected together or both anodes connected together. The specific arrangement including JFET 310, gate resistor 345 and semiconductor diodes 341, 342 constitutes one example for normally-on transistor 110, voltage clamping element 140 and gate resistor 135 of the embodiment illustrated in FIG. 1.

Figure 4:
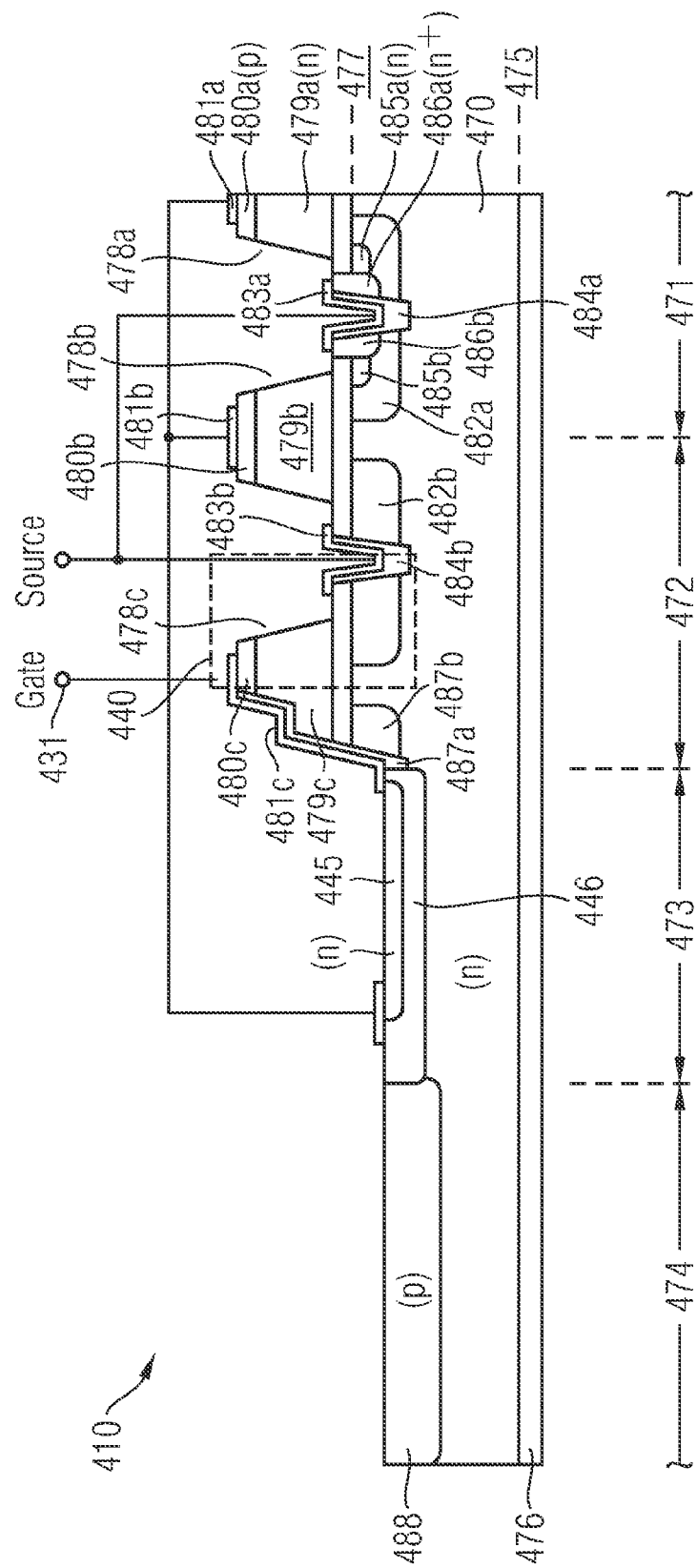
FIG. 4 illustrates a schematic cross-sectional view of a portion of a SiC semiconductor die including a JFET, a gate resistor and a vertical voltage clamping element.

FIG. 4 illustrates a schematic cross-sectional view of a portion of an n-channel JFET 410 formed within an n-type SiC semiconductor substrate 470. JFET 410 includes a transistor cell area 471, a voltage clamping element area 472, a gate resistor area 473 and an edge termination area 474. At a rear side 475 of the SiC semiconductor substrate 470 a drain contact region 476 made of a conductive material such as a metal or metal alloy is formed. Within the transistor cell area 471 and at a front side 477 of the SiC semiconductor substrate 470, mesa portions 478a, 478b are formed. These mesa portions 478a, 478b include n-type semiconductor zones 479a, 479b and p-type gate regions 480a, 480b. On the gate regions 480a, 480b gate contacts 481a, 481b made of a conductive material such as a metal or metal alloy are formed. Between the mesa portions 478a, 478b and within the SiC semiconductor substrate 470 a p-type region 482a is formed. This p-type region 482a is electrically coupled to a source trench contact 483a made of a conductive material such as a metal or metal alloy via a p$^+$-type contact zone 484a. N-type source regions 485a, 485b and n$^+$-type source regions 486a, 486b are at least partly formed within p-type zone 482a and are also electrically coupled to the source trench contact 483a. The conductivity of a channel region formed between source regions 485a . . . b, 486a . . . b and drain contact region 476 may be controlled by a voltage applied between gate contacts 481a . . . b and source trench contact 483a.

In the voltage clamping element area 472, a p-type zone 482b electrically coupled to a trench contact 483b via a p$^+$-type contact region 484b is formed similar to elements 482a, 483a and 484a within the transistor cell area 471. For example, p-type zones 482a, 482b, p$^+$-type contact regions 484a, 484b and trench contacts 483a, 483b may be formed by same process steps and may thus be equal with regard to choice of materials and shapes.

The voltage clamping element area 472 furthermore includes a mesa portion 478c. Similar to mesa portions 478a, 478b, also mesa portion 478c includes an n-type zone 479c and a gate region 480c. The voltage clamping element area 472 may include further p-type regions such as regions 487a and 487b. The sequence of p-type gate region 480c, n-type zone 479c and p-type zone 482b constitutes a voltage clamping element 440 including a pair of anti-serial pn junction diodes. An anode of the first diode such as diode 341 illustrated in FIG. 3 is formed by p-type gate region 480c and the cathode of this first diode is formed by n-type zone 479c. N-type zone 479c also constitutes the cathode of the second pn junction diode such as diode 342 illustrated in FIG. 3 and p-type zone 482b corresponds to the anode of this second pn junction diode. The semiconductor regions 480c, 479c and 482b constituting anti-serial pn junction diodes are arranged along a vertical direction perpendicular to the rear side 475.

On the p-type gate region 480c a gate contact 481c is formed as a gate terminal 431 of JFET 410. The gate contact 481c extends into the gate resistor area 473 and provides electrical contact to one terminal of a gate resistor 445. The gate resistor 445 is formed as an n-type semiconductor zone embedded in a p-type semiconductor zone 446. The other terminal of gate resistor 445 is electrically coupled to the gate contacts 481a, 481b of the transistor cells within the transistor cell area 471. The gate resistor 445 may be formed by diffusion or implant of n-type dopants of a dose appropriately chosen to fix a value of resistor 445 to a desired value or within a desired range of values.

Within the edge termination area 474 a p-type edge termination zone 488 is formed.

Each of the gate contacts 481a, 481b of the transistor cells within the transistor cell area 471 are electrically coupled to the gate terminal 431 via the gate resistor 445 similar to the respective part of the circuit diagram including normally-on FET 110, the gate resistor 135 and the gate terminal 131 illustrated in FIG. 1. Applying the SiC semiconductor substrate 470 with JFET 410 in the cascode circuit arrangement illustrated in FIG. 1, generation of oscillations may be eliminated or reduced by provision of gate resistor 445.

In the voltage clamping element area 472, the voltage clamping element 440, i.e., the anti-serial pn junction diodes formed of p-type region 480c and n-type region 479c as well as n-type region 479c and p-type region 482b limits a voltage drop between gate and source of JFET 410. Within p-type region 482b, n-type regions similar to source regions 485a . . . b, 486a . . . b may be formed. Thus, when applying the SiC semiconductor substrate 470 including JFET 410 in the cascode circuit arrangement illustrated in FIG. 1, the voltage drop between drain and source terminals 127 and 125 of the normally-off transistor 105 may be limited and thus, occurrence of avalanche breakdown in normally-off transistor 105 may be reduced or eliminated leading to an improved device reliability.

Figure 5:
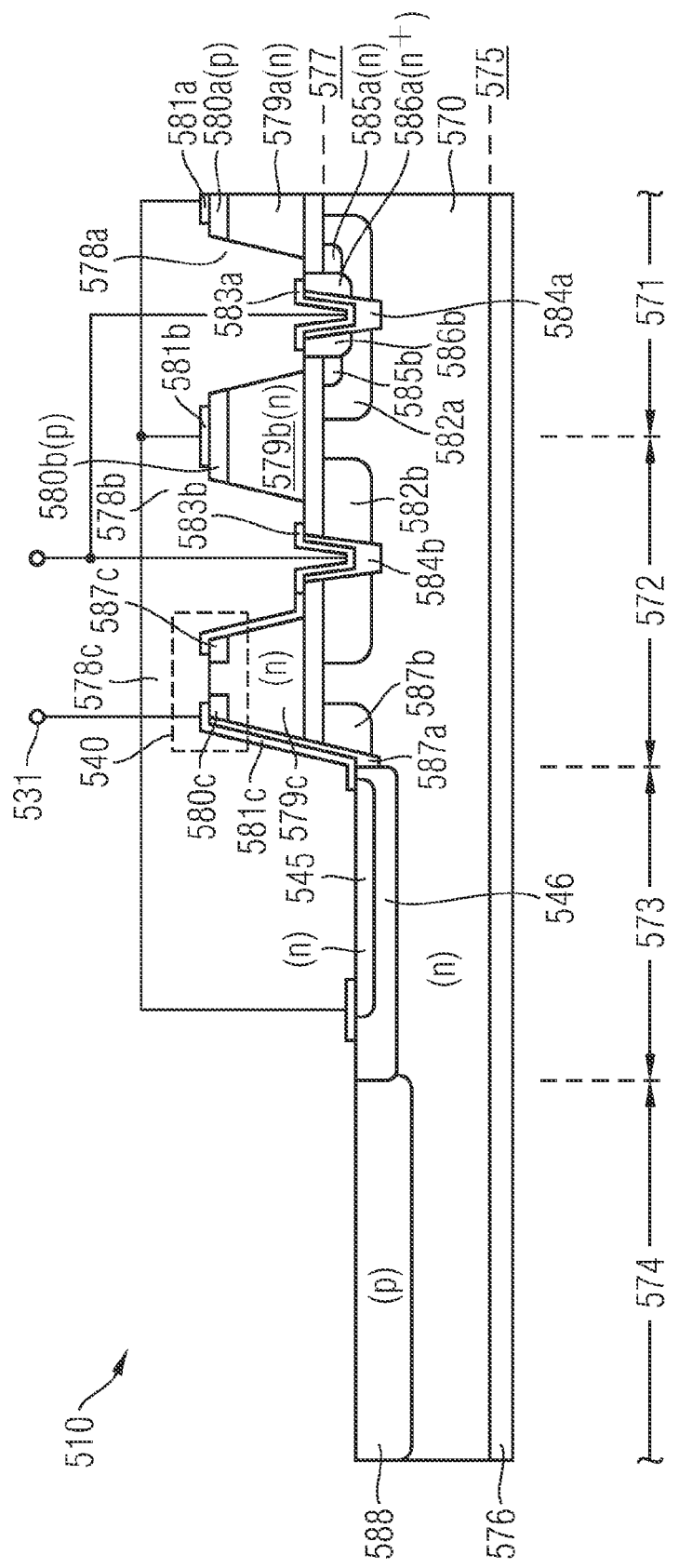
FIG. 5 illustrates a schematic cross-sectional view of a portion of a SiC semiconductor die including a JFET, a gate resistor and a lateral voltage clamping element formed in a mesa region.

FIG. 5 illustrates a schematic cross-sectional view of a portion of an n-channel JFET 510 formed within an n-type SiC semiconductor substrate 570.

JFET 510 includes a transistor cell area 571, a gate resistor area 573 and an edge termination area 574 similar to the active cell area 471, the gate resistor area 473 and the edge termination area 474 of JFET 410 illustrated in FIG. 4. For details on these device areas reference is taken to the respective description parts above.

JFET 510 differs from JFET 410 illustrated in FIG. 4 with regard to the design of the voltage clamping element area 572. Whereas JFET 410 includes a vertical voltage clamping element 440 formed by p-type region 480c, n-type region 479c and p-type region 482b, JFET 510 includes a lateral voltage clamping element 590 formed by p-type region 580c, n-type region 579c and p-type region 587c sequentially arranged along a lateral direction in parallel to the rear side 575. Voltage clamping element 590 is formed at a top side of mesa region 578c. Since the two p-type regions 580c and 587c are both arranged opposed to each other at the top side of mesa region 578c having n-type region 579c arranged in between, current through voltage clamping element 540 flows along the lateral direction. A source contact 583b extends to the top side of mesa region 578c and is in electrical contact with a top side of p-type region 587c. Thus, a current path through p-type region 587c may be kept shorter than the current path through corresponding p-type region 482b of the embodiment illustrated in FIG. 4. Thus, a resistance of this p-type region which is connected in series to the anti-serial diodes may be kept smaller than in the embodiment of FIG. 4 assuming equal specific resistance values of the corresponding p-type regions in FIGS. 5 and 4. Hence, voltage clamping characteristics of voltage clamping element 540 are improved.

Figure 6:
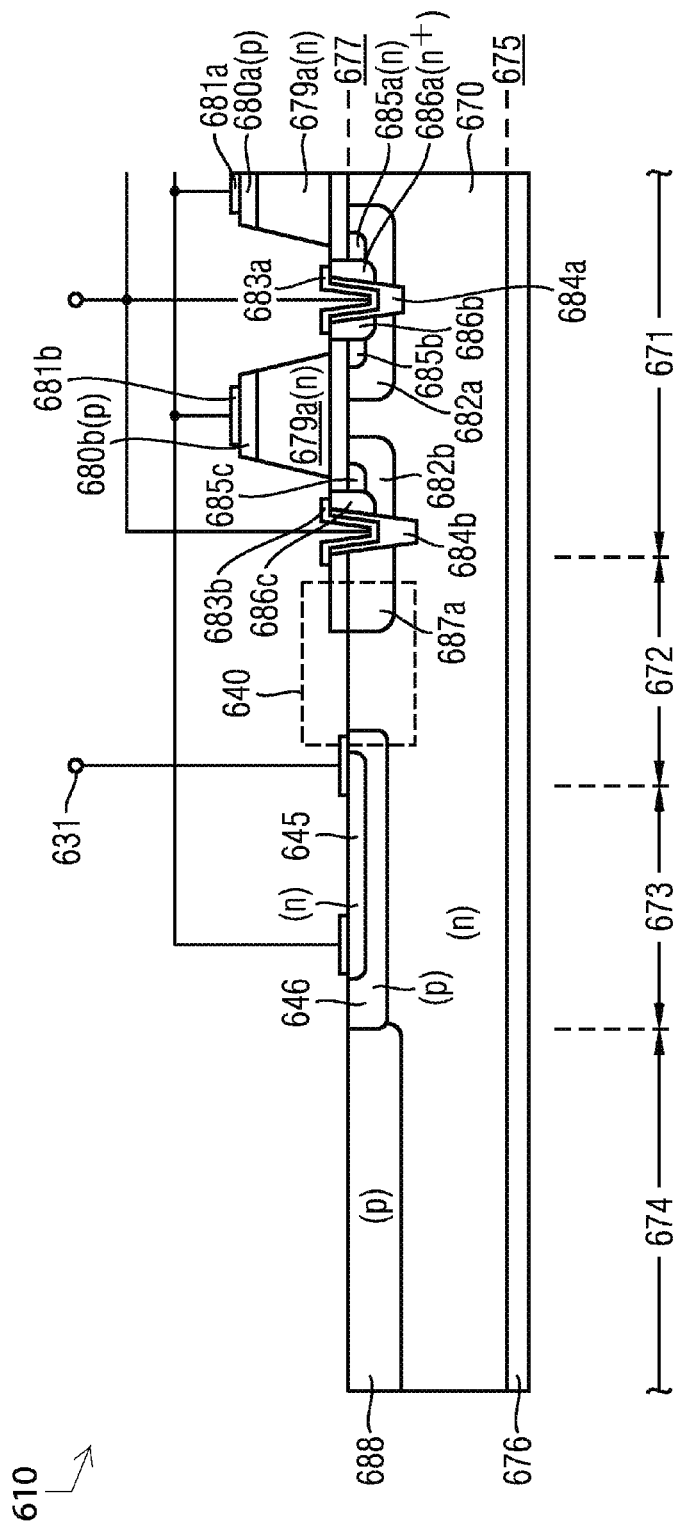
FIG. 6 illustrates a schematic cross-sectional view of a portion of a SiC semiconductor die including a JFET, a gate resistor and a lateral voltage clamping element formed at a front side of the SiC semiconductor die.

FIG. 6 illustrates a schematic cross-sectional view of a portion of an n-channel JFET 610 formed within an n-type SiC semiconductor substrate 670.

JFET 610 includes a transistor cell area 671, a gate resistor area 673 and an edge termination area 674 similar to the active cell area 471, the gate resistor area 473 and the edge termination area 474 of JFET 410 illustrated in FIG. 4. For further details on these device areas reference is taken to above description related to the corresponding areas of FIG. 4.

JFET 610 differs from JFET 410 illustrated in FIG. 4 with regard to the design of the voltage clamping element area 672. Whereas JFET 410 includes a vertical voltage clamping element 440 formed by p-type region 480c, n-type region 479c and p-type region 482b, JFET 610 includes a lateral voltage clamping element 640 formed by p-type region 687a, a part of n-type semiconductor substrate 670 and p-type zone 646 sequentially arranged along a lateral direction in parallel to and at the front side 677. Different from the embodiment illustrated in FIG. 5, voltage clamping element 640 is arranged outside of a mesa portion. Since the two p-type regions 646 and 687a are both arranged at the front side 677 having a part of n-type semiconductor substrate 670 arranged in between, current through voltage clamping element 640 flows along a lateral direction parallel to the front side 677. Similar to the embodiment illustrated in FIG. 5, a source contact 683b is in electrical contact with a top side of p-type region 687a. Thus, a current path through p-type region 687a may be kept shorter than the current path through corresponding p-type region 482b of the embodiment illustrated in FIG. 4. Thus, a resistance of this p-type region which is connected in series to the anti-serial diodes may be kept smaller than in the embodiment of FIG. 4 assuming equal specific resistance values of the corresponding p-type regions in FIGS. 5 and 4. Hence, voltage clamping characteristics of voltage clamping element 640 are improved.

Figure 7:
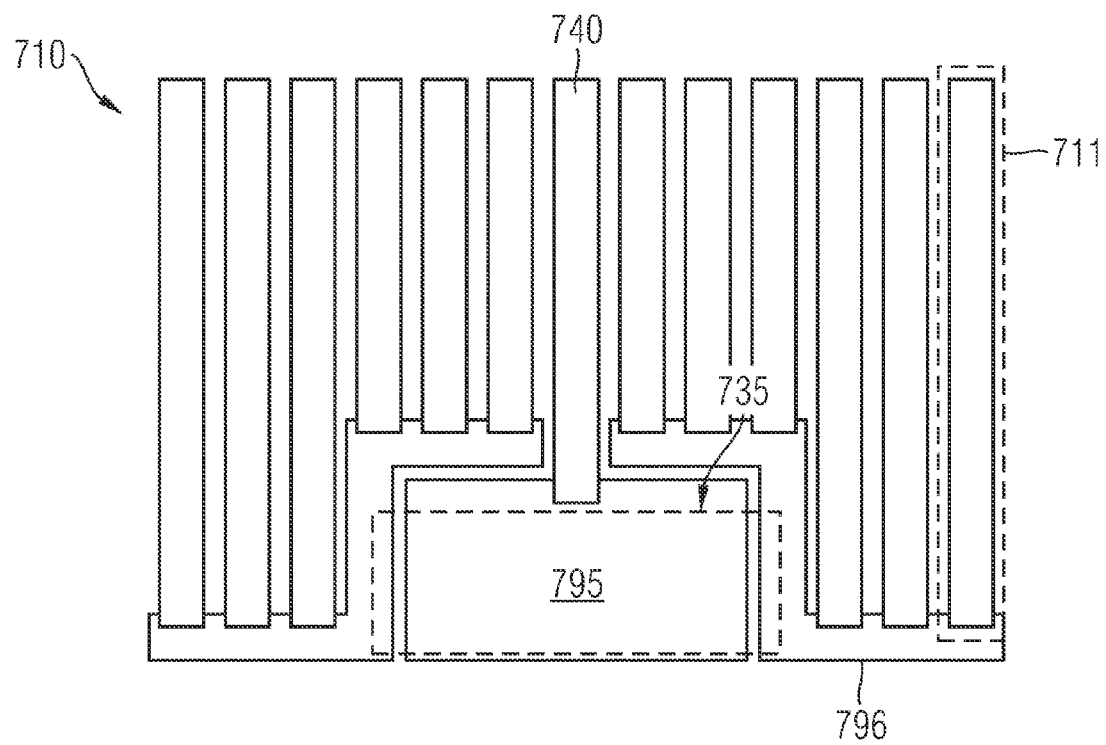
FIG. 7 illustrates a schematic layout of a JFET, a gate resistor and a voltage clamping element.

FIG. 7 illustrates a schematic layout of a JFET 710 including JFET transistor cells such as cell 711, a voltage clamping element 740 and a gate resistor 735. The gate resistor 735 overlaps with a gate pad area 795. The JFET cells such as cell 711 are in the form of stripes, i.e., also the gate contacts of each JFET cell are stripe-shaped and are electrically coupled to a gate runner 796. The layout of FIG. 7 including JFET 710, gate resistor 735 and voltage clamping element 740 is an example of the circuit arrangement illustrated in FIG. 3 with regard to JFET 310, gate resistor 345 and voltage clamping element 340.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a first semiconductor die including a normally-off transistor;
   a second semiconductor die including a plurality of transistor cells of a normally-on transistor, one of a source terminal/drain terminal of the normally-off transistor being electrically coupled to a gate terminal of the normally-on transistor, the other one of the source terminal/drain terminal of the normally-off transistor being electrically coupled to one of a source terminal/drain terminal of the normally-on transistor; and wherein
   the second semiconductor die includes
   a gate resistor electrically coupled between the gate terminal of the normally-off transistor and respective gates of the plurality of transistor cells; and
   a voltage clamping element electrically coupled between the gate terminal and the one of the source terminal/drain terminal of the normally-on transistor, respectively.

2. The semiconductor device of claim 1, wherein the second semiconductor die includes a semiconductor substrate made of SiC and the normally-on transistor is a normally-on Junction Field Effect Transistor.

3. The semiconductor device of claim 2, wherein the first semiconductor die includes a semiconductor substrate made of Si and the normally-off transistor is a normally-off Metal Insulator Field Effect Transistor.

4. The semiconductor device of claim 1, wherein the normally-on transistor is a normally on High Electron Mobility Transistor.

5. The semiconductor device of claim 1, wherein the voltage clamping element includes a pn junction diode.

6. The semiconductor device of claim 1, wherein a clamping voltage of the voltage clamping element is smaller than an electrical breakdown voltage between source and drain of the normally-off transistor.

7. The semiconductor device of claim 1, wherein the gate resistor is within a range of $0.5\Omega$ to $500\Omega$.

8. The semiconductor device of claim 1, wherein a ratio of electrical breakdown voltages of the normally-off transistor and the normally-on transistor is within a range of 1:5 to 1:100.

9. The semiconductor device of claim 1, wherein an area of the gate resistor at least partially overlaps with a gate pad area electrically coupled to the gate terminal of the normally-on transistor.

10. The semiconductor device of claim 5, wherein both the pn junction diode and the transistor cells of the normally-on transistor have striped-shaped geometries, the pn junction diode extending in parallel to the transistor cells.

11. The semiconductor device of claim 1, wherein the first semiconductor die and the second semiconductor die are arranged chip-on-chip in a single package in a sequence of a leadframe, the second semiconductor die and the first semiconductor die.

12. The semiconductor device of claim 11, wherein the single package includes a gate pin, a source pin and a drain pin, the gate pin being electrically coupled to the gate terminal of the normally-off transistor, the source pin being electrically coupled to the one of the source terminal/drain terminal of the normally-off transistor, the drain pin being electrically coupled to the other one of the source terminal/drain terminal of the normally-on transistor.

13. A Junction Field Effect Transistor, comprising:
   a SiC semiconductor substrate of a first conductivity type;
   a plurality of transistor cells including a common drain at a rear side of the SiC semiconductor substrate, wherein each of the plurality of transistor cells includes gate regions and source regions at a front side of the SiC semiconductor substrate;
   a gate resistor, wherein one terminal of the gate resistor is electrically coupled to a gate terminal and the other terminal of the gate resistor is electrically coupled to the gates of the plurality of transistor cells; and wherein
   a sequence of a first semiconductor zone of a second conductivity type opposite to the first conductivity type, a second semiconductor zone of the first conductivity type and a third semiconductor zone of the second conductivity type is electrically coupled between the gate terminal and a source terminal, the source terminal being electrically coupled to the source regions of the plurality of transistor cells.

14. The Junction Field Effect Transistor of claim 13, wherein the gate resistor is a semiconductor resistor formed within the SiC semiconductor substrate.

15. The Junction Field Effect Transistor of claim 13, wherein each of the transistor cells includes a semiconductor region having a same shape, same dopants and a same profile of dopants than the third semiconductor region.

16. The Junction Field Effect Transistor of claim 13, wherein the gate resistor includes a fourth semiconductor zone embedded in the first semiconductor zone.

17. The Junction Field Effect Transistor of claim 13, wherein the gate resistor is within a range of $0.5\Omega$ to $500\Omega$.

18. The Junction Field Effect Transistor of claim 13, wherein an area of the gate resistor at least partially overlaps with a pad area of the gate terminal.

19. The Junction Field Effect Transistor of claim 13, wherein the Junction Field Effect Transistor is a normally-on transistor.

20. The Junction Field Effect Transistor of claim 13, wherein the first, second and third semiconductor zones are arranged along a lateral direction extending in parallel to a surface of the rear side.

21. The Junction Field Effect Transistor of claim 13, wherein the first, second and third semiconductor zones are arranged along a vertical direction extending perpendicular to a surface of the rear side.

22. The Junction Field Effect Transistor of claim 13, wherein each of the transistor cells includes a mesa portion.

23. The Junction Field Effect Transistor of claim 22, wherein the first, second and third semiconductor zones are arranged at a top side of the mesa portion.

\* \* \* \* \*